United States Patent
Choi et al.

(10) Patent No.: US 11,725,272 B2
(45) Date of Patent: Aug. 15, 2023

(54) METHOD, SYSTEM AND APPARATUS FOR COOLING A SUBSTRATE

(71) Applicant: CANON KABUSHIKI KAISHA, Tokyo (JP)

(72) Inventors: Byung-Jin Choi, Austin, TX (US); Seth J. Bamesberger, Austin, TX (US); Alex Ruiz, Spicewood, TX (US); Nilabh K. Roy, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 8 days.

(21) Appl. No.: 17/516,511

(22) Filed: Nov. 1, 2021

(65) Prior Publication Data

US 2023/0137182 A1 May 4, 2023

(51) Int. Cl.
*C23C 14/50* (2006.01)
*C23C 14/54* (2006.01)

(52) U.S. Cl.
CPC ............ *C23C 14/541* (2013.01); *C23C 14/50* (2013.01); *C23C 14/542* (2013.01)

(58) Field of Classification Search
CPC ...... C23C 14/541; C23C 14/50; C23C 14/542
See application file for complete search history.

(56) References Cited

U.S. PATENT DOCUMENTS

| | | |
|---|---|---|
| 5,970,717 A | 10/1999 | Tateyama |
| 6,499,777 B1 | 12/2002 | Wang |
| 6,578,287 B2 | 6/2003 | Aswad |
| 6,832,885 B2 | 12/2004 | Sanders et al. |
| 7,274,005 B2 | 9/2007 | Quach et al. |
| 9,463,938 B2 | 10/2016 | Toyozawa |
| 2007/0151515 A1 | 7/2007 | Kim |
| 2011/0253037 A1 | 10/2011 | Tsunekawa et al. |
| 2020/0043759 A1* | 2/2020 | Zhang ............... H01L 21/67248 |

* cited by examiner

*Primary Examiner* — Hai Y Zhang
(74) *Attorney, Agent, or Firm* — Canon U.S.A., Inc. IP Division

(57) ABSTRACT

Techniques and mechanisms for cooling a substrate in a processing chamber by a bi-directional cooling process prior to transferring the substrate outside the processing chamber are provided. First cooling gas is introduced into the processing chamber from an upper gas source in a downward direction towards the upward facing surface of the substrate. An apparatus is placed underneath and in proximity to the substrate. Second cooling gas is introduced from the apparatus into the processing chamber in an upward direction towards the downward facing surface of the substrate. One or more gaps are cut out of the body portion of the apparatus, the gaps configured to allow the apparatus to avoid contact with the support structure holding the substrate, as the apparatus is moved in a horizontal direction into position underneath the substrate during placement of the body portion of the apparatus in proximity to the substrate.

15 Claims, 6 Drawing Sheets

METHOD, SYSTEM AND APPARATUS FOR COOLING A SUBSTRATE

BACKGROUND

Field

This disclosure relates generally to semiconductor device fabrication and more particularly to techniques and mechanisms for cooling a substrate after it has been heated to a high-temperature during semiconductor processing.

Description of Related Art

Many processes that are performed in semiconductor processing require a semiconductor wafer or other such substrate to undergo very high treatment or processing temperatures. Heating to a high temperature is used in various processes to trigger physical and/or chemical reactions to improve the physical, optical, electrical, or chemical properties of the wafer in order to enhance the performance or quality of a resulting integrated circuit or semiconductor device, for example.

High temperature post processing may be required after processes for patterning, plasma etching, coating, cleaning, ion implantation, or the like. In a typical processing procedure, a wafer is transferred from a room temperature storage device by a robotic wafer handler into a processing or reaction chamber, where it is subjected to a high temperature treatment or processing and is then transferred by the wafer handler from the high temperature chamber to a chamber for cooling the wafer, or back to the same storage device or to a separate storage device for processed wafers.

After heating a wafer to a high temperature, the wafer often needs to be cooled before it can undergo a next step. For example, during post processing for stabilizing a substrate after an Inkjet-enabled Adaptive Planarization (IAP) process, semiconductor wafers are typically heated to a temperature between about 250 C° and about 460° C. As another example, during rapid thermal processing (RTP), semiconductor wafers are typically briefly heated to a temperature between about 400° C. and about 1,200° C., by applying a heating process to the semiconductor wafer for a period of time.

There is usually a maximum wafer temperature that a robotic wafer handler can handle. Furthermore, the maximum wafer temperature at which the wafer can be transported outside the processing chamber into an oxygen rich environment without undergoing substantial surface oxidation may be only about 230° C.

In such circumstances, a cool down using a natural passive radiative and/or convective process, for example, is usually not practical. For example, even where the wafer is moved away from a baking plate, it has been found that, using passive cooling, an initial cooling in a processing chamber from a temperature of about 460° C. to a temperature of about 230° C. (at which the wafer can be transferred outside the processing chamber into an oxygen rich environment without undergoing substantial surface oxidation) can take on average more than 10 seconds.

This is very expensive from a processing time perspective. A manufacturer of an integrated circuit or semiconductor device needs to minimize processing times in order to maximize throughput. Without effective cool down processes, the total cycle time for each wafer may become too high, increasing the cost of each wafer.

Thus improved techniques and mechanisms for cooling a wafer are needed.

SUMMARY

Various embodiments of the present disclosure relate to a cooling process that can be performed in a processing chamber and that cools a substrate by directing cooling gases towards both the upper and lower surfaces of the substrate prior to transferring the substrate outside the processing chamber.

According to one embodiment of the present disclosure, a substrate is heated to a high temperature in a processing chamber, while the substrate is held in a first position; when held in the first position, the substrate is located in proximity to a heat source. Next, the substrate is raised to a second position in the processing chamber, the second position being above the first position. When held in the second position, the substrate is located in proximity to an upper gas source and held by a support structure of the processing chamber. During a period of time that the substrate is held in the second position by the support structure: (1) first cooling gas is introduced into the processing chamber from the upper gas source; the first cooling gas is introduced into the chamber in a downward direction towards the upward facing surface of the substrate, (2) an apparatus is placed underneath and in proximity to the substrate such that a substantially horizontal plane of a body portion of the apparatus is positioned substantially parallel to and below a substantially horizontal plane of the downward facing surface of the substrate, and (3) second cooling gas is introduced, from the body portion of the apparatus, into the processing chamber in an upward direction towards the downward facing surface of the substrate. One or more gaps are cut out of the substantially horizontal plane of the body portion of the apparatus; the gaps are configured to allow the apparatus to avoid contact with the support structure holding the substrate, as the apparatus is moved in a horizontal direction into position underneath the substrate during placement of the body portion of the apparatus in proximity to the substrate to perform cooling. While the apparatus is positioned underneath and in proximity to the substrate, the apparatus is located between the substrate and the heat source.

Features and advantages of embodiments of the present disclosure will become apparent from a reading of the following detailed description of example embodiments, when taken in conjunction with the appended drawings, and provided claims.

BRIEF DESCRIPTION OF THE DRAWINGS

FIG. 3A provides a view from above of the end effector according to one embodiment, and FIG. 3B provides a cross-sectional view of a configuration of a processing chamber and the end effector as bi-directional cooling of a substrate is being performed according to one embodiment.

DETAILED DESCRIPTION OF THE EMBODIMENTS

Overview

Various embodiments of the present disclosure seek to provide improved techniques and mechanisms for cooling down a wafer during a semiconductor fabrication process. As discussed in the Background section, it is often desirable for the wafer temperature to be brought down from the processing temperature to a lower temperature before the wafer is moved outside a high temperature processing chamber or picked up by a wafer handling device, for example. At the same time, a wafer cooling technique must be compatible with the environment of the high temperature processing chamber. Additionally, the technique must be simple enough so that it does not significantly add to the per-wafer cost of processing. Further, it is desirable for wafer temperatures to be brought down slowly to prevent dislocations and wafer breakage due to thermal shock, and it is desirable for a substantial uniformity in wafer cooling to be maintained to avoid deformation of the wafer during cooling.

Example embodiments of the present disclosure will be described in detail below with reference to the attached drawings. The following example embodiments are not intended to limit the scope of the present invention, and not all of the combinations of features described in the example embodiments and the below claims are necessarily required for a solution of the present disclosure. The configurations of the example embodiments can be appropriately modified or changed depending on specifications and various conditions (such as a use condition and a usage environment) of apparatuses to which the present invention is applied. The technical scope of the present invention is determined by the claims, and is not limited by the following individual example embodiments.

For example, while example embodiments are described in the context of a single-wafer, showerhead gas flow processing chamber, it will be understood by a person of ordinary skill in the art that the cooling mechanisms and techniques of the present invention are not limited to any specific type of reactors or processing chambers. Rather, the skilled person will find application for the principles disclosed herein in connection with a number of different types of processing chambers or reactors, including other types of vertical gas flow processing chambers, horizontal gas flow processing chambers, curing chambers, deposition chambers, as well as cluster tools and batch processing systems, etc. Furthermore, while the applications have particular utility for cooling down wafers before removing the wafer from a processing chamber, the principles disclosed herein have application whenever it is desirable to cool an object prior to handling or storage.

Figure 1:
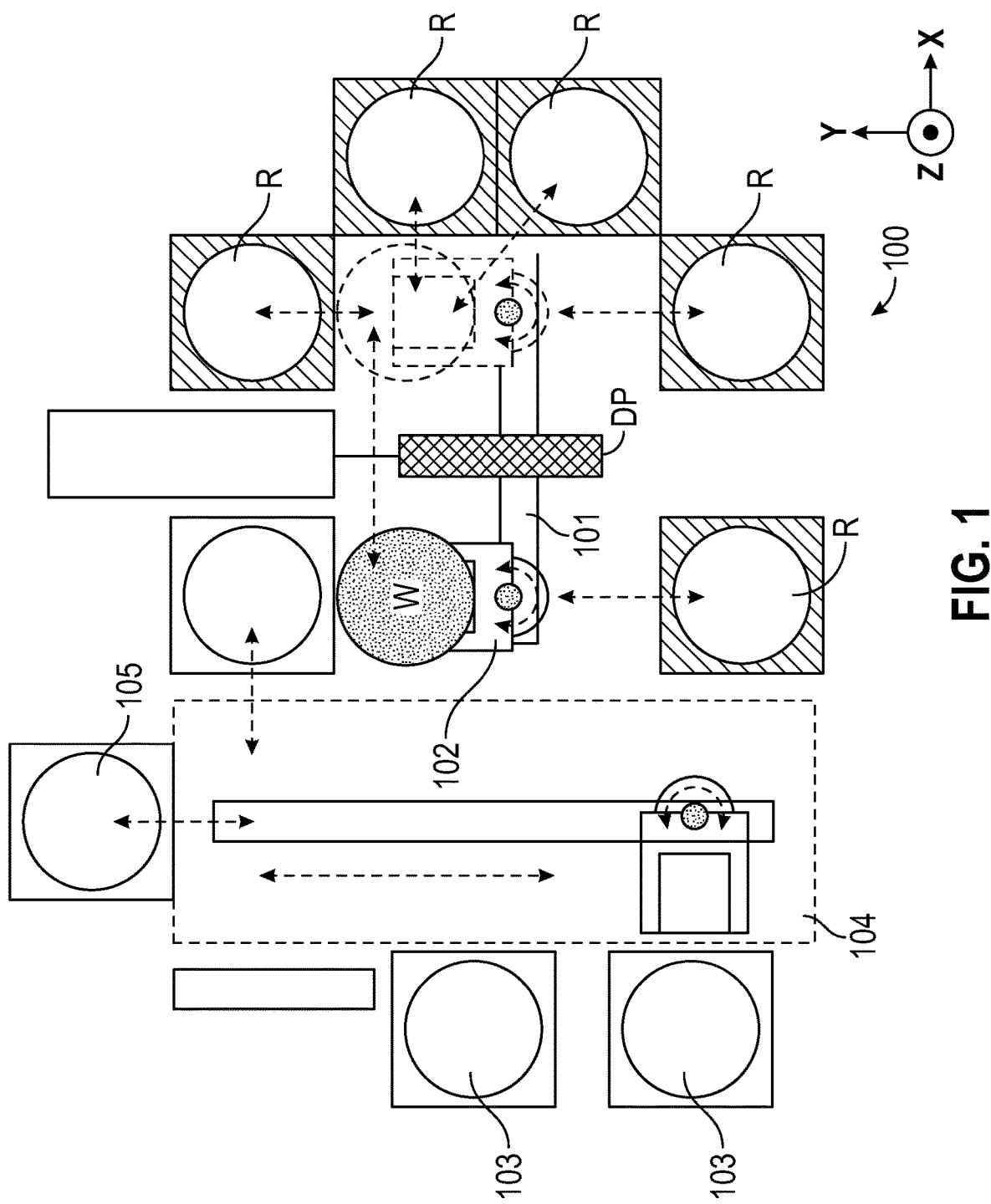
FIG. 1 is schematic diagrams illustrating an example of a portion of a system for performing Inkjet-enabled Adaptive Planarization (IAP) process including a processing chamber for heating and bi-directionally cooling a substrate according to one embodiment.

Heating and Cooling Down Wafers During Inkjet-Enabled Adaptive Planarization Processing FIG. 1 illustrates a portion of an Inkjet-enabled Adaptive Planarization (IAP) system including a high temperature processing chamber and an EFEM end effector according to one embodiment. The embodiment shows a context in which the techniques and mechanisms of the present disclosure can be applied. It involves a wafer cool down that is performed in a high temperature processing chamber after a substrate W has undergone high temperature post processing following an Inkjet-enabled Adaptive Planarization (LAP) process.

Note that while the example embodiment illustrated in FIG. 1 relates to an IAP planarization process, embodiments of the present invention are not limited to this context. Embodiments of the present disclosure can be applied to any context in which cool down of a wafer or other object could be useful.

To provide some background regarding IAP, as demand for smaller and smaller semiconductor devices and integrated circuits has continued, increasingly sophisticated microfabrication techniques have been developed. One such technique is nanoimprint lithography.

Nanoimprint lithography uses a patterning technology that involves field-by-field deposition of a low viscosity resist onto a substrate (using jetting technology), patterning of the resist, and then exposure of the resist to UV radiation or heat to achieve curing. Specifically, a patterned mask is lowered into the resist fluid after deposition of the resist onto the substrate. The resist then flows into the relief patterns in the mask by capillary action. Following this filling step, the resist is then cross linked by being irradiated with UV radiation or applying heat to achieve curing, for example. Then the mask is removed, leaving a patterned resist on the substrate.

It has been found that nanoimprint lithography technology can accurately reproduce patterns with a higher resolution and greater uniformity than those produced by typical photolithography techniques.

A similar approach can also be used to remove patterns or other topography on a semiconductor wafer, to flatten or planarize a substrate. This technique, which is used to create a planar surface on which to perform patterning, is referred to as Inkjet-enabled Adaptive Planarization (IAP). It has proven effective at achieving planarization of different pattern densities, even in the presence of pre-existing substrate topography.

In various embodiments of the present disclosure, droplets of a light curing resist are jetted onto a substrate, for example. In some embodiments, the volume distribution of the light curing resist is determined at least in part by the pre-existing substrate topography and pattern layout. Next, a flat surface is brought into contact with the applied composition from above, and the resist is then irradiated with UV rays or heat in the contacted state to cure the resist. After the curing step, the substrate W may be baked in the high temperature processing chamber 105 to stabilize the integrity of the cured, patterned resist and to avoid uncontrolled shrinkage. Shrinkage/contraction or strain relaxation can vary depending on the thicknesses in different parts of the substrate W and thus can be damaging to a wafer.

As shown in FIG. 1, a portion of an Inkjet-enabled Adaptive Planarization (IAP) system 100 according to the first embodiment has a substrate conveying module 104 (also called an EFEM (Equipment Front End Module) end effector 104, and planarization processors R arranged around a substrate conveying structure 101. A high temperature processing chamber 105 and the substrate conveying containers 103 are connected to the EFEM end effector 104. The substrate conveying structure 101 includes a substrate holder 102 that holds the substrate W. The substrate conveying structure 101 receives the substrate W and conveys the substrate W to the plurality of planarization processors R and under a dispenser DP by using a translation, vertical, and rotational moving mechanism.

The high temperature processing chamber 105 can perform a baking process (heating process) and a cleaning process on the substrate W. The high temperature processing chamber 105 may be formed to be part of the planarization apparatus 100 or may be an apparatus different from the planarization apparatus 100 which is connected to the planarization apparatus 100.

The EFEM end effector 104 may be configured to be part of the planarization apparatus 100, or may be an apparatus different and separate from the planarization apparatus 100, which is connected to the planarization apparatus 100. The EFEM end effector 104 loads substrates stored in the substrate conveying container 103 into the planarization apparatus 100. The substrate conveying container 103 is also called a FOUP, and can store a plurality of substrates and load and unload substrates.

The planarization processors R internally and sequentially execute a plurality of steps in a planarization process.

The substrate W may be composed of glass, a ceramic, a metal, a semiconductor, a resin, or the like. A member made of a material different from the substrate may be formed on the surface of the substrate, as needed. More specifically, the substrate can include a silicon wafer, a compound semiconductor wafer, silica glass, or the like.

The high temperature processing chamber 105 may incorporate a plurality of high temperature processing chambers. For example, the high temperature heating chamber 105 may execute baking and cleaning with respect to a single wafer or it may perform processes on a predetermined number of substrates W by a batch scheme upon stacking the substrates W at predetermined intervals in the vertical direction or upon spreading them in the horizontal direction at predetermined intervals. After completing the IAP curing process, the IAP system 100 may directly convey the substrates W, returned to the EFEM end effector 104, to the high temperature processing chamber 105, thereby providing needed high temperature post processing right after the curing step in the IAP process has been completed. The processing chamber 105 may bake the substrate W at about 250 C° to 460° C.

As noted above, the maximum wafer temperature at which the wafer can be transported outside the processing chamber into an oxygen rich environment without undergoing substantial surface oxidation may be only about 230° C. Accordingly, techniques for actively cooling down a wafer before transferring the wafer outside the processing chamber 105 are desired.

Figure 2A:
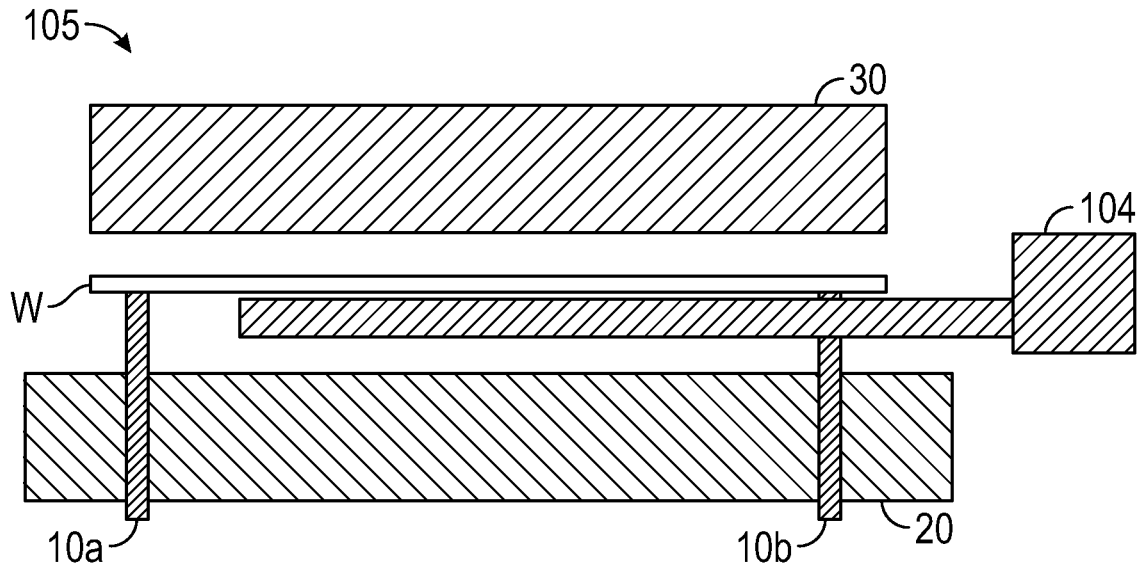
FIG. 2A is a schematic cross-sectional view of a processing chamber according to one embodiment, with the substrate in a wafer loading position.
Figure 2B:
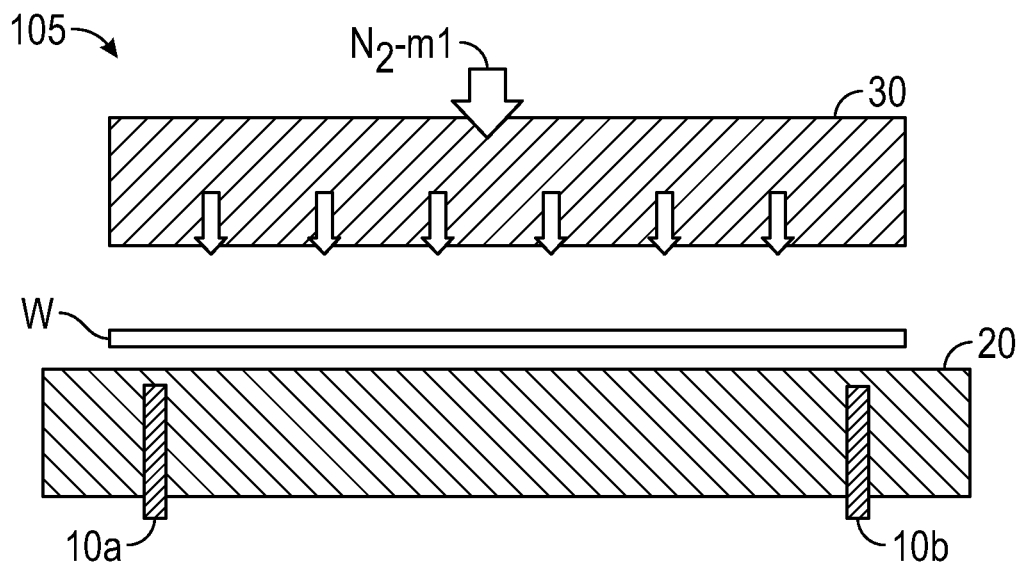
FIG. 2B is a schematic cross-sectional view of a processing chamber according to one embodiment, with the substrate in a heating position.
Figure 2C:
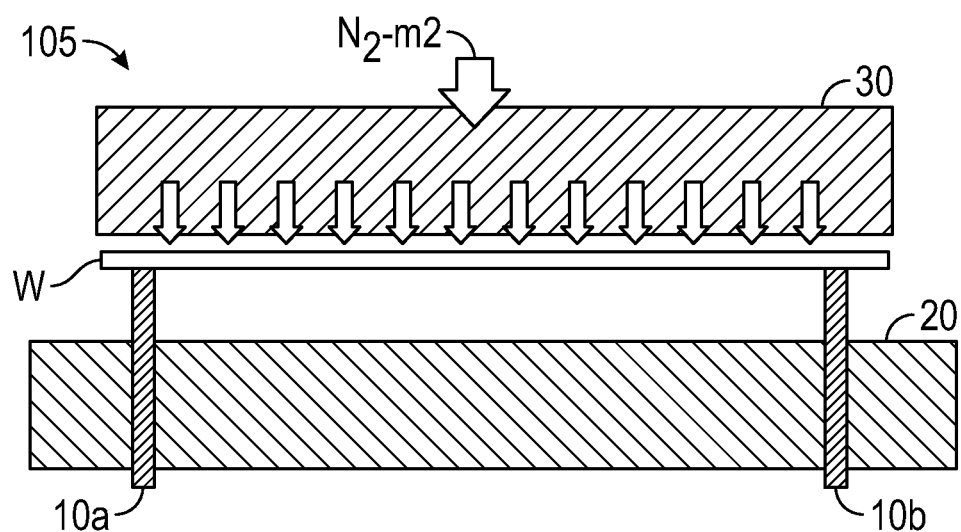
FIG. 2C is a schematic cross-sectional view of a processing chamber according to one embodiment, with the substrate in a cooling position.
Figure 3A:
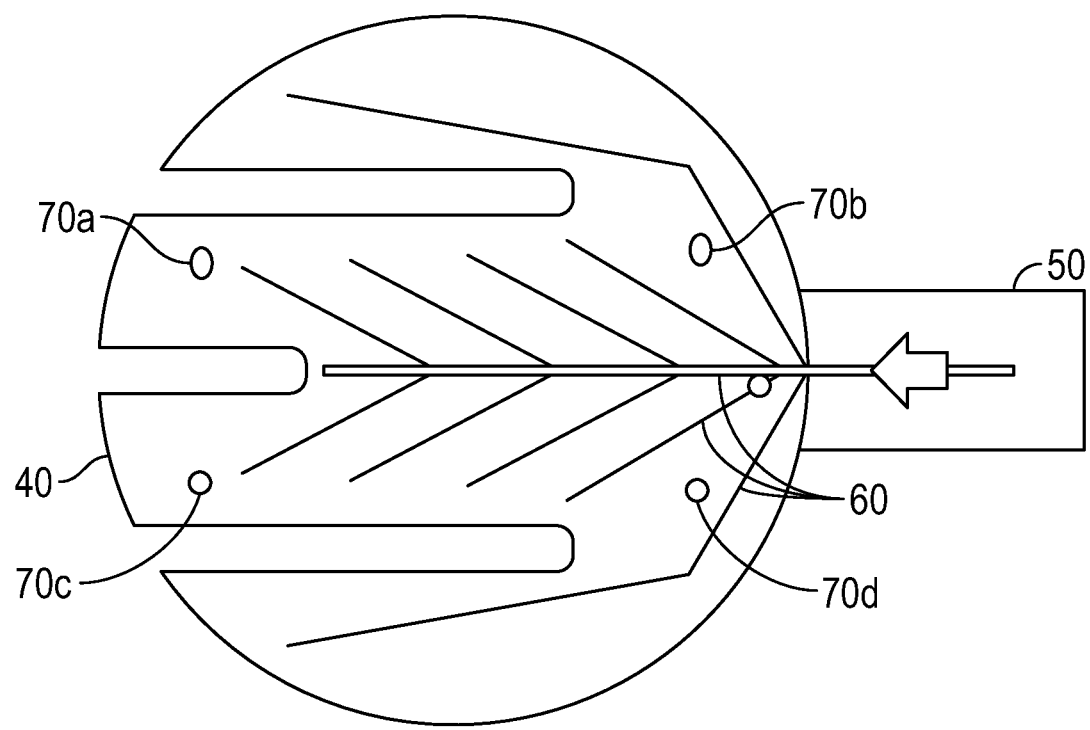
FIGS. 3A and 3B provide views of an end effector for wafer handling and cooling according to one embodiment.
Figure 3B:
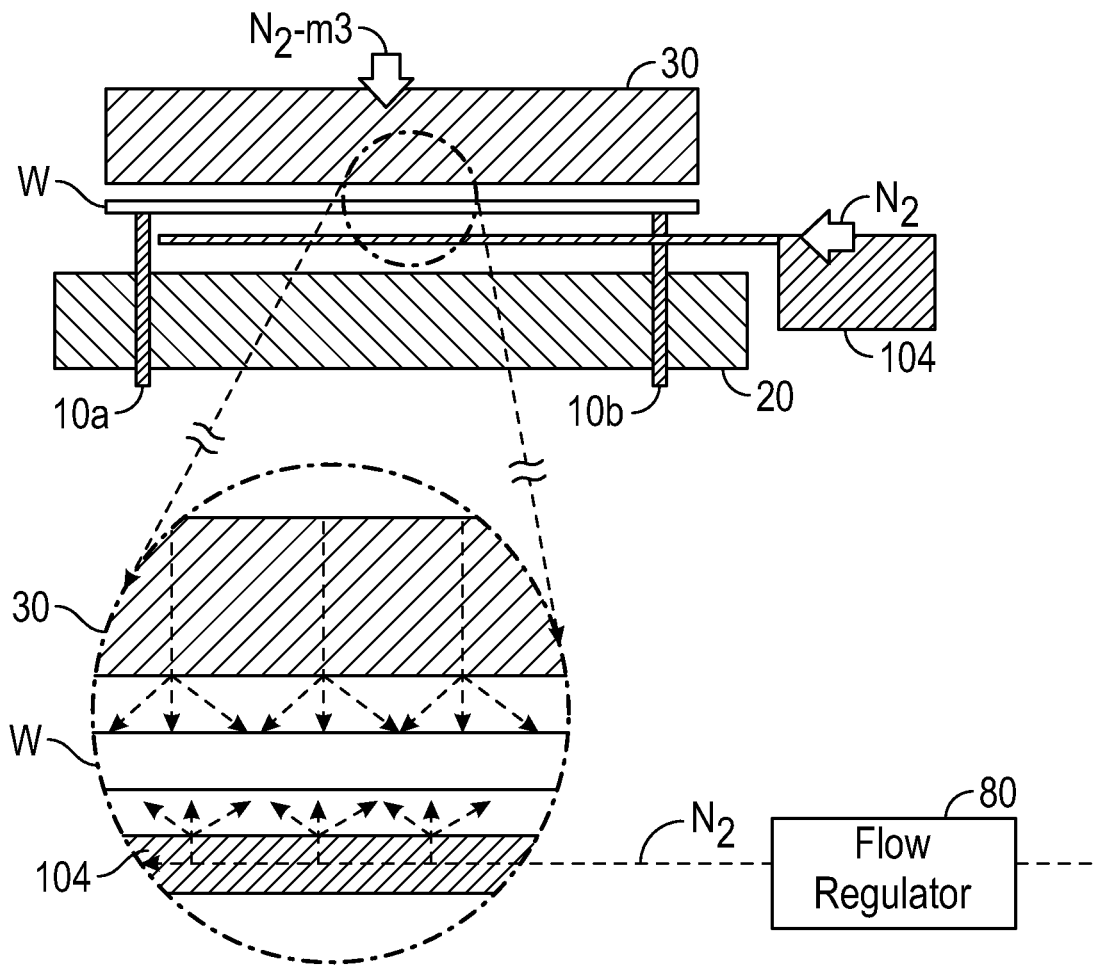

Next, a first example embodiment of techniques and mechanisms for cooling a substrate bi-directionally in a processing chamber will be described. FIGS. 2A-2C and 3B provide schematic cross-sectional views of a portion of the interior of a high temperature processing chamber 105 constructed in accordance with the first example embodiment. FIGS. 3A and 3B provide further details regarding the configuration and use of EFEM end effector 104 and processing chamber 105 in accordance with the first example embodiment. For convenience, elements similar to those in earlier Figures will be referred to by like reference numerals.

Configuration of High Temperature Processing Chamber

The processing chamber 105 can be used for both heating and cooling in various embodiments of the present disclosure. FIG. 2A illustrates a configuration of the processing chamber 105 in which the substrate W is in a wafer loading position. FIG. 2B illustrates a configuration of the processing chamber 105 in which the substrate W is in a position for high temperature processing. FIG. 2C illustrates a configuration of the processing chamber 105 in which the substrate W is in a cooling position and is being cooled with gas from a gas distribution showerhead 30. FIG. 3B illustrates a configuration of the processing chamber 105 in which the substrate W is being cooled bi-directionally by a first cooling gas from above (from the gas distribution showerhead 30), and a second cooling gas from below (from the EFEM end effector 104) while the substrate W is held in the cooling position.

The high temperature processing chamber 105 is defined by an upper wall, a lower wall, and side walls (not illustrated), and includes a port (not illustrated) by which the chamber can be opened and closed, and through which substrates can be inserted and removed. In one alternative embodiment, there is no port and the chamber 105 is defined by an upper portion and a lower portion which are separable to allow substrates to be inserted and removed from the chamber 105. The chamber 105 also includes three lifting pins 10a-10b for lifting and holding a semiconductor substrate W in different positions in the high temperature processing chamber 105, a baking plate 20 for heating the substrate W, and the upper gas source 30 (located at or near the upper wall of the chamber) for introducing gas in a downward direction into the processing chamber 105.

In the illustrated embodiment, the upper gas source is a gas distribution showerhead device 30. The gas distribution showerhead 30 features a face plate having gas outlet ports. The gas outlet ports can take the form of circular holes, and/or elongated slots or channels according to desired gas distribution. The gas distribution showerhead device 30 is connected to a gas line (not illustrated) which is in turn connected to a gas flow regulator (not illustrated) which regulates the rate at which the showerhead 30 introduces gas into the processing chamber 105.

Lifting pins 10a-10b for directly supporting the semiconductor substrate W or other processing substrate or work piece are provided. The lifting pins 10a-10b are vertically translated by an external driving mechanism or actuator. The pins 10 can be raised into the heating chamber or retracted down into the baking plate 20 (or the bottom wall of the processing chamber 105) to place the wafer in whatever position is needed for a current processing or loading step.

While the structure supporting the wafer in the processing chamber is shown to be lifting pins 10a-10b in FIGS. 2A-2C and 3B, it is to be understood that the invention is not limited to the use of lifting pins as the support structure. In other embodiments, the wafer may be lifted and/or supported by another type of lifting and/or support mechanism for holding semiconductor wafers. The support structures can consist of either one or more solid support structures or include a plurality of spaced support points spaced apart from each other, for example.

However, the support structure 10 usually cannot include a susceptor or another such device that contacts most of the downward facing surface of the substrate W as it supports the substrate. This is because whatever structure is used to support the substrate W, must leave a large portion of the downward facing surface of the substrate W exposed (in the supported state), so that a device (for example, an EFEM end effector 104) can direct cooling gas from below in an upward direction towards the downward facing surface of the substrate W, to cool the substrate W—while the device is positioned below and in proximity to the substrate W.

In various embodiments, the same structure which directly supports the wafer 20 during the high temperature processing (namely, the lifting pins 10a-10b) supports the substrate W as it is moved into the cooling position, and also holds the substrate W while it is in the cooling position. Accordingly, cooling of the substrate W can be performed without the need for the substrate W to be handled by a special high-temperature handling device. Moreover, since no transfer to a wafer handler is required to move the substrate W to the cooling position, the risk of dropping, scratching or otherwise damaging the substrate W while it is still hot is minimized.

As noted above, the lifting pins 10a-10b can also be translated vertically by the external driving mechanisms or motor. It will be further understood by one of skill in the art that, in other embodiments, the external motor may drive a shaft to be elevated, and the vertical translation can lift the shaft and the wafer 14. Alternatively, the lifting pins can extend through another support structure in lifting the wafer directly. During lifting, the wafer 14 can remain directly supported by the same wafer support structure which supports the wafer during processing or by another wafer support structure.

Configuration of EFEM End Effector for Wafer Handling and Cooling

FIGS. 3A and 3B are schematic diagrams providing views of the EFEM end effector 104 in accordance with the first embodiment. FIG. 3A provides a view from above the end effector 104, and FIG. 3B provides a cross-sectional view of the heating chamber 105 with the end effector 104 in a position beneath the substrate W, from which position it can cool the substrate W.

As shown in FIG. 3A, the EFEM end effector 104 has a handle portion 50 configured to act as a conduit for cooling gas from an external gas line (not shown), and a body portion 40 (sometimes referred to as a paddle) configured to receive the cooling gas from the handle portion 50 and introduce the cooling gas into the high temperature processing chamber 105 to cool a substrate W being held by the lifting pins 10a-10b.

The EFEM end effector 104 is configured such that a substantially horizontal plane of the body portion 40 of the EFEM end effector 104 can be positioned substantially parallel to and below a substantially horizontal plane of the downward facing surface of the substrate W. In addition, an array of openings (not illustrated) in the upper surface of the body portion 40 of the EFEM end effector 104 are provided through which cooling gas can be introduced into the high temperature processing chamber in an upward direction towards the downward facing surface of the substrate W, while the substrate W is held by the lifting pins 10a-10b and the body portion 40 of the EFEM end effector 104 is positioned underneath the substrate W. Through these openings or gas outlet ports, the EFEM end effector can blow cooling gas up to bottom of the substrate W to perform convective cooling.

The array of openings or gas outlet ports through which the cooling gases are introduced into the high temperature processing chamber 104 are connected to channels and/or cavities 60 in the body portion 40 of the EFEM end effector 104, the channels 60 continuing in the handle portion 50 of the EFEM end effector 104, and eventually connected to external gas lines (not illustrated) and a flow regulator 80.

The openings/gas outlet ports for introducing the gas into the processing chamber 105 can consist of pin holes, gas nozzles, or the like. They can have a circular shape or be configured as gaps or channels.

As shown in FIG. 3A, the body portion 40 of the EFEM end effector 104 is disk-shaped, with a diameter slightly smaller than that of the substrate W, which is also disk shaped. Accordingly, in various embodiments, the horizontal plane of the substrate W and the horizontal plane of the body portion 40 of the EFEM end effector 104 are similar in both size and shape, with the surface area of the body portion 40 of the end effector being slightly smaller than that of the substrate W. This allows for more uniform distribution of cooling gases onto the downward facing surface of the substrate W as well as providing a more effective heat shield between the substrate W and the baking plate 20. Note that in some embodiments the surface area of the body portion 40 of the EFEM end effector 104 is designed to be slightly smaller than that of the substrate W, to allow wafer handling devices to make contact with the edges of the wafer, if needed.

Note the EFEM end effector 104 is able to be placed underneath and in proximity to the substrate W even though the lifting pins 10a-10b are already positioned underneath the substrate W (holding the substrate W in position) because of a feature of the EFEM end effector 104. Specifically, as illustrated in FIG. 3A, the EFEM end effector 104 is constructed such that one or more gaps are cut out of the substantially horizontal plane of the body portion 40 of the EFEM end effector 104. These gaps are configured both in placement and size to allow the EFEM end effector 104 to avoid contact with the lifting pins 10a-10b (or other support structure) holding the substrate W, as the EFEM end effector 104 is moved in a horizontal direction into position underneath the substrate W during placement of the body portion 10 of the EFEM end effector 104 in proximity to and underneath the substrate W. In some instances, the location and size of the gaps are specifically designed in view of the location and size of the lifting pins 10a-10b (or other support structure) of the high temperature processing chamber 105.

The EFEM end effector 104 is composed of materials that have thermal properties such that, while the EFEM end effector 104 is positioned between the substrate W and the baking plate 20, the EFEM end effector 104 acts as a thermal barrier blocking radiative and conductive heat emanating from the baking plate 20 from the substrate W.

Typically, while it is necessary that end effectors be heat resistant, since the expectation is that end effectors will usually not spend a significant amount of time in high temperature processing chambers, EFEM end effectors are often constructed of materials with a lower thermal mass. This is to enable them to be as light as possible, so they can move faster and use less power.

In various embodiments of the present disclosure, by contrast, to enable the body portion 40 of the end effector 104 to act as a more effective heat shield, the EFEM end effector 104 is composed of material(s) with a specific heat capacity higher than that of substrate W so that it can absorb more heat. In addition, the thickness of end effector body portion 40 can be selected by the skilled artisan to balance the material costs and available space with advantageously high total heat capacity. Desirably, the body portion 40 of the EFEM end effector 104 has a thermal mass greater than that of the substrate W. In some embodiments, the body portion 40 of the EFEM end effector 104 has a thermal mass that is 2 to 10 times the thermal mass of the substrate W. In addition, the lower surface of the body portion of the apparatus is configured to reflect radiant heat by selecting a material with appropriate wavelength reflectance.

Further, the EFEM end effector 104 is configured to transfer the substrate W seated on the upper surface of the body portion 40 of the EFEM end effector 104 from an interior of the processing chamber 105 to a next processing or storage location outside the processing chamber 105. Thus, in some embodiments, the upper surface of the body portion of the apparatus is equipped with vacuum pads 70a-70d that enable the apparatus to hold the substrate W more securely in place on the body portion 40 of the EFEM end effector, as the substrate W is being transported. Note that in other embodiments, passive pads may be used in place of vacuum pads.

FIG. 3B provides a schematic cross-sectional view of the high temperature processing chamber 104, with the substrate W held in a cooling position and the body portion 40 of the EFEM end effector 40 positioned underneath and in proximity to the substrate W. For convenience, elements similar to those in FIGS. 1, 2A-2C will be referred to by like reference numerals. The inset in FIG. 3B provides a zoomed in cross sectional view of a portion of the substrate W as it is being cooled bi-directionally by gas from the gas distribution showerhead 30 and gas from the EFEM end effector 104.

As shown in FIG. 3B, an array of gas outlet ports or openings in the upper surface of the body portion 40 of the EFEM end effector 104 are provided through which cooling gas can be introduced into the high temperature processing chamber in an upward direction towards the downward facing surface of the substrate W.

In the inset in FIG. 3B, a zoomed in view is provided of a portion of the main image of FIG. 3B. The inset provides an illustration of the paths by which the first cooling gas and the second cooling gas travel from external gas lines (not illustrated) to the high temperature processing chamber 105 via the gas distribution showerhead 30 and the EFEM end effector 104, respectively. The gases expand as they escape from outlet ports of the gas distribution showerhead 30 and the EFEM end effector 104 into the atmosphere of the processing chamber 105. So that when the gases hit the substrate W they have a larger impact circumference than the size the gases had as they departed from their respective gas outlet ports.

As shown in the inset in FIG. 3B, the rate of flow at which the cooling gas flows into the EFEM end effector 104 is controlled by a gas flow regulator 80 located outside the EFEM end effector 104 and outside the high temperature processing chamber 105. The flow regulator 80 can include a flow control valve, and it regulates the flow or pressure of gas (fluid) into the EFEM end effector 104 and the processing chamber 105. In some embodiments, the flow control valve responds to signals generated by a separate device such as a flow meter or a temperature gauge.

Figure 4:
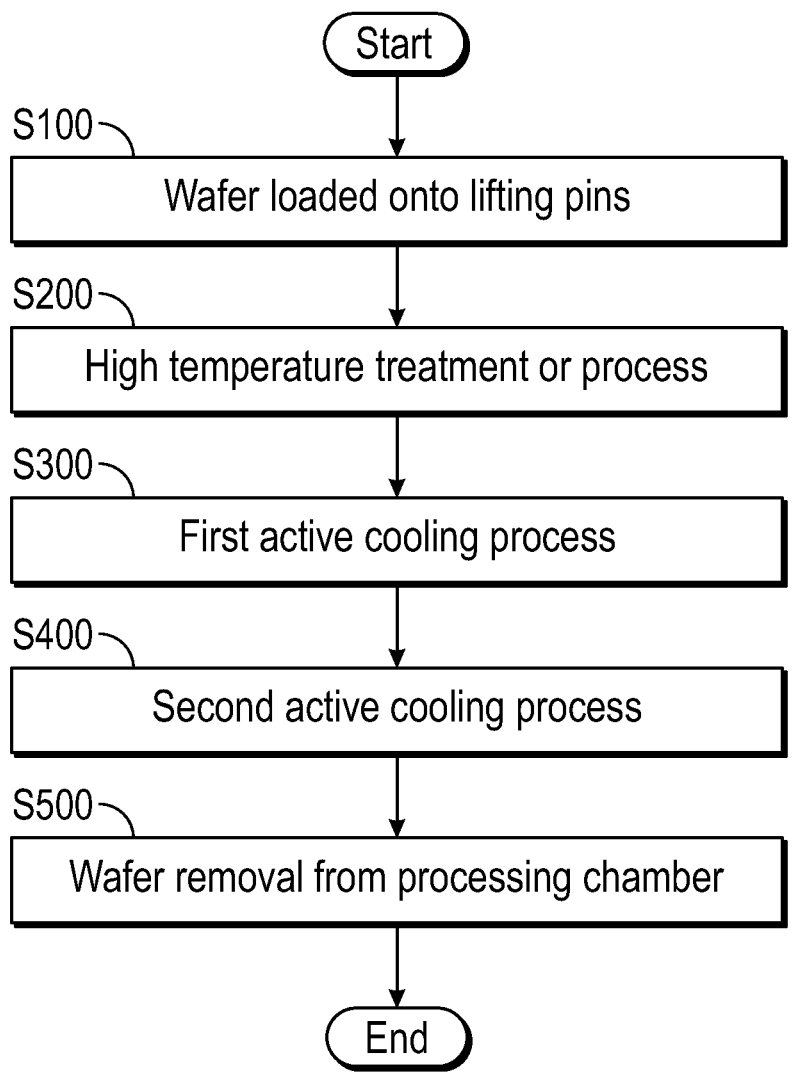
FIG. 4 is a flowchart illustrating an example of processing for heating and then bi-directionally cooling a substrate in a processing chamber according to one embodiment.

Next, a process flow for an integrated cooling system for cooling a substrate W in a high temperature processing chamber 105 will be described. FIG. 4 is a flowchart showing steps in a process for heating and then bi-directionally cooling a substrate W in a high temperature processing chamber 105 according to one embodiment. As shown in FIG. 4, a process flow for a single substrate W can include a wafer loading step, a heating step, a first active cooling step, a second active cooling step, and a removal from processing chamber step. The process flow can be executed in the above described order.

Wafer Loading

During a wafer loading step S100, the lifting pins 10a-10b start from a position of being initially retracted down into the baking plate 20, and then, once a substrate conveying device places the substrate W at the wafer loading position in the processing chamber 105, the lifting pins are lifted up until they contact and then support the substrate W. Once the substrate W is supported by the lifting pins 10a-10b, the substrate conveyance device can be removed from the chamber leaving the substrate W on the lifting pins 10a-10b, and completing the transfer process. Note that in various embodiments the substrate conveying device can be the EFEM end effector 104 described in FIG. 1.

Heating Wafer

In a heating step S200, after the substrate W is loaded onto the lifting pins 10a-10b as illustrated above in FIG. 2A, next, the lifting pins 10a-10b are retracted down to lower the substrate W to a heating position in which the substrate W is located in proximity to the baking plate 20. In the illustrated embodiment, the lifting pins 10a-10b are retracted down inside the baking plate 20 and the substrate W sits on multiple bumps on the baking plate 20 during the baking step. During the baking, the temperature of the substrate is elevated to a certain target temperature and then maintained at that temperature for a predetermined period of time. When held in the heating position, there is only a gap of about 0.05-1.0 mm between the substrate W and the baking plate 20. Alternatively, in other embodiments, the gap may be of a different magnitude, for example, between about 0.1-0.3 mm. Note that while a baking plate is described as the heat source in the illustrated embodiment. In other embodiments, the heat source could be a different device or system.

During the heating step, in some embodiments, nitrogen gas (as a purge gas) is sent into the high temperature processing chamber 105 from the gas distribution showerhead 30 located at or near the upper wall of the high temperature processing chamber 105. The introduction of the nitrogen gas into the processing chamber 105 can assist in enabling uniform temperature distribution in the heating chamber, as well as helping to evacuate gases evaporated from the substrate W, which might otherwise interfere with semiconductor processing. Because the nitrogen gas is mainly introduced to flush out the gas being dissipated from the heated substrate surface, the nitrogen gas is introduced at a relatively low flow rate (m1) by the showerhead 30.

Any purge gases conventionally used in this type of high temperature reactor and process can be used in place of nitrogen in other embodiments. Examples of suitable alternative purge gases include argon, hydrogen, and helium. The use of a purge gas with a high heat conductivity, such as helium and hydrogen, can be advantageous in some circumstances. Such purge gas can serve as a heat conduction medium between the substrate and the gas distribution showerhead 30.

First Active Cooling

In a first active cooling step S300, cooling nitrogen gas is introduced into the processing chamber from the gas distribution showerhead 30.

During the first active cooling step S300, as illustrated in FIG. 1C, the substrate W is first raised to a cooling position. The raising can be performed by using an external driving mechanism or motor to vertically translate the lifting pins 10a-10b. When held in the cooling position, the substrate is held in proximity to the outlet ports of the gas distribution showerhead 30; in this position, there may be a gap of only about 0.2-10.0 mm between the substrate W and the showerhead 30. It is noted that in alternative embodiments the gap may be of a different magnitude.

Once the substrate W is held in the cooling position by the lifting pins 10a-10b, the rate of flow of the showerhead 30 is increased from the rate (m1) used during the baking operation, to a higher rate of flow (m2) to enhance the effectiveness of the cooling operation. The showerhead's rate of flow can be controlled by a controller that is part of the heating chamber 105 or part of the showerhead apparatus 30 itself.

In various embodiments, the temperature of the nitrogen gas is not manipulated to be different as between the baking step and the first cooling step. Rather, the temperature of the nitrogen gas (which is also referred to as the first cooling gas herein) that is used is its usual temperature. Gas supplied from the showerhead usually remains at a pretty consistent temperature and usually remains cooler than the wafer target body temperature. This temperature is largely determined by the temperature of the showerhead assembly, for example. That is, the existing rest temperature of the gas as it flows from a gas line (not shown) through the gas distribution showerhead 30 to the processing chamber 105 is used. The reason this temperature suffices to cool the wafer is because, as the temperature of the processing chamber 105 rises to a high temperature during the baking operation, the temperature of the nitrogen gas becomes lower than the temperature of the processing chamber 105, and the nitrogen gas can thus act as a "cooling" gas during the first and second active cooling steps.

Second Active Cooling

During the second active cooling step S400, as illustrated in FIG. 3B, the substrate W is cooled bi-directionally, by first cooling gas from the showerhead 30 and second cooling gas from the EFEM end effector 104.

The substrate W continues to be held by the three lifting pins 10a-10b, and the gas distribution showerhead 30 continues to introduce first cooling gas into the heating chamber in a downward direction towards the upward facing surface of the substrate W, as the substrate W is held in the cooling position by the lifting pins 10a-10b, in the second active cooling step. In some embodiments, the gas distribution showerhead 30 may reduce the rate of flow (m3) of the cooling gas it is introducing into the high temperature processing chamber 105 during the second active cooling step, from the rate (m2) used during the first active cooling step to a slower rate (m3).

In addition, during the second active cooling step, while the substrate W is being held in the cooling position, the EFEM end effector 104 is inserted from the exterior of the high temperature processing chamber 105 into the interior of the high temperature processing chamber 105. And then the body portion 40 of the EFEM end effector 104 is placed underneath and in proximity to the substrate W such that a substantially horizontal plane of a body portion 40 of the EFEM end effector 104 is positioned substantially parallel to and below a substantially horizontal plane of the downward facing surface of the substrate W. When positioned underneath the substrate W, there is about a 1-3 mm gap between the body portion 40 of the EFEM end effector 104 and the downward facing surface of substrate W.

After the EFEM end effector 104 has been placed in position underneath and in proximity to the substrate W, as described above, the EFEM end effector 104 begins introducing a second cooling gas, from the body portion 40 of the EFEM end effector 104, into the high temperature processing chamber in an upward direction towards the downward facing surface of the substrate W. In an embodiment, the force from the flow rate supplied by the gas distribution showerhead 30 during the second active cooling step is always greater than the force of the flow rate to the wafer bottom side supplied by the EFEM end effector 104.

As described above, the lifting pins 10a-10b (or whatever other support structure is being used) must be configured such that they only contact the substrate W at one or a relatively small number of discrete spots, during the second active cooling phrase. In other words, a large portion of the downward facing surface of the substrate W must be left exposed (in the supported state). This is to allow a device (for example, an EFEM end effector 104) to direct cooling gas from below in an upward direction towards the downward facing surface of the substrate W, to cool the substrate W, without obstructions being in the way.

The gas that the EFEM end effector 104 conveys and introduces into the processing chamber 105 may be the same type of gas introduced by the gas distribution showerhead 30 or it may be another type of gas. As with the first cooling gas, examples of suitable gases for the second cooling gas include argon, hydrogen, nitrogen, and helium. The use of a gas with a high heat conductivity, such as helium and hydrogen, can be advantageous in some circumstances. Such gas can serve as a heat conduction medium between the substrate W and the end effector 104.

The temperature of the cooling gas introduced by the gas distribution showerhead 30 (also referred to as the "first cooling gas" herein) is generally cooler than the temperature of the heated wafer but is usually warmer than the ambient atmospheric temperature outside the processing chamber 105 because the showerhead assembly generally heats up as the processing chamber 105 is heating up, as noted above. By contrast, the temperature of the second cooling gas is generally consistent with the ambient temperature outside the processing chamber, as the EFEM end effector is usually outside the processing chamber 105.

Notably, in various embodiments, no effort is made to manipulate the temperature of the first or second cooling gases. Rather, the natural temperature differences and contrasts a between the temperature of the first cooling gas (as described above) and the temperature of the substrate W, and the temperature of the second cooling gas (as described above) and the temperature of the substrate W, will be enough to achieve cooling of the substrate W. Both the first cooling gas the second cooling gas achieve cooling by proximal convection, but the convection efficiency of the second cooling gas is usually better because of the lower temperature of the second cooling gas introduced by the EFEM end effector 104.

As an alternative embodiment, the temperature of the second cooling gas can be maintained at a certain temperature by recirculating liquid in the body portion 40 of the end effector 104. That is, the body portion 40 can be maintained at a controlled body temperature using the recirculating liquid to cool the body portion by conduction. Controlling the temperature of the body portion 40 of the EFEM end effector 104 can maintain the temperature of the second cooling gas.

Note that the first cooling gas is introduced into the processing chamber 105 by the upper gas source 30 before the second cooling gas starts being introduced into the processing chamber 105 by the EFEM end effector 104. Further, the time period that the first cooling gas is introduced into the heating chamber overlaps at least in part with the time period that the second cooling gas is introduced into the heating chamber. Such bi-directional cooling of the substrate W continues until the substrate W has been cooled to a temperature below a predetermined first target temperature—the first target temperature being, for example, the temperature at which the substrate W can be taken outside the processing chamber 105 into an oxygen rich environment without risking substantial surface oxidation.

It will be recognized by the skilled artisan that other cooling methods can also be employed within the high temperature processing chamber 105, in combination with the illustrated mechanisms, thereby minimizing cool down times.

Wafer Removal from Processing Chamber

During the wafer removal step S500, after the substrate W is cooled sufficiently so that the substrate W can be transported outside the high temperature processing chamber into an oxygen rich environment, the substrate W is lowered by the lifting pins 10a-10b to a height where the substrate W can be placed on the body portion 40 of the EFEM end effector 104 which is located beneath the substrate W in the processing chamber 105. Then the lifting pins 10a-10b are lowered still further to transfer the substrate W from the lifting pins 10a-10b to the upper surface of the body portion 40 of the EFEM end effector 104.

The EFEM end effector 104 then takes over supporting the substrate W and acts as the wafer handler that transports the substrate W to its next destination. In some embodiments, the EFEM end effector 104 transports the substrate W outside the high temperature processing chamber 104, through an oxygen rich environment, until it arrives at a chill module (not illustrated) that is separate from the heating chamber 105, and not part of a same integrated enclosure. The substrate W is then cooled to a second target temperature by the chill module.

In such embodiments, the first target temperature to which the substrate W is cooled in the processing chamber 105 is just an initial cooling temperature for avoiding surface oxidation for example, during the period of time that the wafer is transported through an oxygen rich environment to the chill module. The cooling process continues at the chill module, and the temperature of the substrate W is reduced further at the chill module to a second target temperature.

The second target temperature could be one of the following: a temperature at which a predetermined handling mechanism can pick up and transport the substrate, a temperature at which the substrate can undergo a predetermined next processing, or a temperature at which the substrate can be stored in a predetermined storage device, for example.

As noted above, in some embodiments, the substrate W seated on the upper surface of the body portion 40 of the EFEM end effector 105 is transferred from an interior of the heating chamber to a next processing location or storage location outside the heating chamber. The substrate W seated on the body portion of the apparatus can also be actively cooled as it is being transported between the high temperature processing chamber 105 and the next destination (which could be a chill module, another processing chamber or a storage cassette, or the like).

Example Method of Manufacturing a Semiconductor Article

An example method of manufacturing a device (for example, a semiconductor device, magnetic storage medium, or liquid crystal display element) as an article will be explained next. This manufacturing method includes a step of forming a pattern on a substrate (for example, a wafer, glass plate, or film substrate) using an imprint apparatus described above. This manufacturing method further includes a step of processing the substrate on which the pattern has been formed. The processing step can include a step of removing the residual film of the pattern. In addition, the method can include other known steps such as a step of etching the substrate using the pattern as a mask. The method of manufacturing an article according to this embodiment is advantageous over the related art in terms of at least one of the performance, quality, productivity, and production cost of articles.

Example Embodiments and Modifications Thereto

Systems, arrangements and methods that are not explicitly shown or described herein, but which embody the principles of the invention are within the spirit and scope of the present invention. It will be appreciated by those skilled in the art that various modifications and changes may be made without departing from the scope of the invention. Such modifications and changes are intended to fall within the scope of the invention.

While the disclosure has been described with reference to example embodiments, it is to be understood that the present disclosure is not limited to the disclosed example embodiments. The scope of the following claims is to be accorded the broadest interpretation so as to encompass all such modifications and equivalent structures and functions.

What is claimed is:

1. A method of cooling a substrate bi-directionally in a heating chamber, the method comprising: heating the substrate to a high temperature while the substrate is held in a first position in the heating chamber, wherein, when held in the first position, the substrate is located in proximity to a heat source; raising the substrate to a second position in the heating chamber, the second position being above the first position, wherein, when held in the second position, the substrate is located in proximity to an upper gas source and held by a support structure; during a period of time that the substrate is held in the second position by the support structure: introducing first cooling gas, from the upper gas source, into the heating chamber in a downward direction towards the upward facing surface of the substrate, placing an apparatus underneath and in proximity to the substrate such that a horizontal plane of a body portion of the apparatus is positioned parallel to and below a horizontal plane of the downward facing surface of the substrate, and introducing second cooling gas, from the body portion of the apparatus, into the heating chamber in an upward direction towards the downward facing surface of the substrate, wherein one or more gaps are cut out of the horizontal plane of the body portion of the apparatus, the gaps configured to allow the apparatus to avoid contact with the support structure holding the substrate, as the apparatus is moved in a horizontal direction into position underneath the substrate during placement of the body portion of the apparatus in proximity to the substrate, and wherein, while the apparatus is positioned underneath and in proximity to the substrate, the apparatus is located between the substrate and the heat source.

2. The method according to claim 1,
wherein an array of gas outlet ports in the upper surface of the body portion of the apparatus is provided through which the second cooling gas is introduced into the heating chamber in an upward direction towards the downward facing surface of the substrate.

3. The method according to claim 1,
wherein the body portion of the apparatus has a thermal mass which is between two and ten times the thermal mass of the substrate, and acts as a thermal barrier shielding the substrate from heat from the heat source when the apparatus is positioned between the substrate and the heat source.

4. The method according to claim 1, further comprising
transferring the substrate seated on the upper surface of the body portion of the apparatus from an interior of the heating chamber to a next processing location or storage location outside the heating chamber, during a transfer period; and
actively cooling the substrate seated on the body portion of the apparatus during the transfer period.

5. The method according to claim 1,
wherein
the first cooling gas is introduced into the heating chamber, by the upper gas source, at a first rate of flow and a first temperature, and the second cooling gas is introduced into the heating chamber, by the apparatus, at a second rate of flow and a second temperature, and
the second temperate is lower than the first temperature.

6. The method according to claim 1,
wherein
the first cooling gas starts being introduced into the heating chamber by the upper gas source before the second cooling gas starts being introduced into the heating chamber by the apparatus, and
the time period that the first cooling gas is introduced into the heating chamber overlaps at least in part with the time period that the second cooling gas is introduced into the heating chamber.

7. The method according to claim 1,
wherein
the cooling process cools the substrate to a temperature that is below a first target temperature,
after the cooling process is completed, the substrate is transported to a cooling chamber to cool the substrate to a second target temperature, and
the second target temperature is one of the following: a temperature at which a predetermined handling mechanism can pick up and transport the substrate, a temperature at which the substrate can undergo a predetermined next processing, or a temperature at which the substrate can be stored in a predetermined storage device.

8. The method according to claim 1,
wherein the temperature of the first cooling gas is determined in large part by the temperature of the physical components of the upper gas source that introduces the first cooling gas into the heating chamber, and the temperature of the second cooling gas is determined in large part by the ambient room temperature outside the heating chamber.

9. The method according to claim 1, wherein the gaps cut out of the horizontal plane of the body portion of the apparatus are adapted in design to the size and location of elements comprising the support structure in the heating chamber, such that the size and location of the gaps are configured to allow the apparatus to avoid contact with the support structure holding the substrate, as the apparatus is moved in a horizontal direction into position underneath the substrate during placement of the apparatus in proximity to the substrate.

10. The method according to claim 1,
wherein the upper gas source introduces purging gas into the heating chamber while the substrate is being heated to a high temperature and while the substrate is held in the first position in proximity to the heat source, the purging gas used to remove unwanted gases from the heating chamber.

11. The method according to claim 1,
wherein
the support structure in the heating chamber is configured such that, when the support structure holds the substrate, the support structure only contacts the substrate at one or a small number of discrete locations, and
said configuration permits the apparatus, when placed in position beneath and in proximity to the substrate, to cool the bottom of the substrate by directing second cooling gas upward towards the downward facing surface of the substrate without obstruction.

12. The method according to claim 1,
wherein
the apparatus is configured to transfer the substrate seated on the upper surface of the body portion of the apparatus from an interior of the heating chamber to a next processing or storage location outside the heating chamber, and
the upper surface of the body portion of the apparatus is equipped with vacuum pads that enable the apparatus to hold the substrate more securely in place on the body portion of the apparatus, as the substrate is being transported by the apparatus.

13. The method according to claim 1,
wherein the body portion of the apparatus is disk-shaped with a diameter slightly smaller than that of the substrate, such that the body portion of the apparatus can block and reflect radiant heat from the heat source when the apparatus is positioned between the substrate and the heat source.

14. The method according to claim 1,
wherein
the first cooling gas and the second cooling gas are introduced into the heating chamber at the same time during a cooling period, the first cooling gas being supplied by the upper gas source at a first rate of flow, and the second cooling gas being supplied by the apparatus at a second rate of flow, and
a force from the first rate of flow supplied by the upper gas source towards the upward facing surface of the substrate during the cooling period is always greater than a force of the second rate of flow supplied by the apparatus towards the downward facing surface of the substrate during the cooling period.

15. A method of manufacturing an article, the method comprising: forming a pattern on a substrate using an imprint apparatus; and processing the substrate, on which the pattern has been formed, to manufacture the article, wherein the imprint apparatus performs imprint processing for forming a pattern of an imprint material on the substrate using a mold, and after performing such imprint processing, performs post processing to heat the substrate to a high temperature while the substrate is held in a first position in a heating chamber, wherein, when held in the first position, the substrate is located in proximity to a heat source; wherein, after completing the heating, the substrate is bi-directionally cooled in the heating chamber by a process comprising: raising the substrate to a second position in the heating chamber, the second position being above the first position, wherein, when held in the second position, the substrate is located in proximity to an upper gas source and held by a support structure; during a period of time that the substrate is held in the second position by the support structure: introducing first cooling gas, from the upper gas source, into the heating chamber in a downward direction towards the upward facing surface of the substrate, placing an apparatus underneath and in proximity to the substrate such that a horizontal plane of a body portion of the apparatus is positioned parallel to and below a horizontal plane of the downward facing surface of the substrate, and introducing second cooling gas, from the body portion of the apparatus, into the heating chamber in an upward direction towards the downward facing surface of the substrate, wherein one or more gaps are cut out of the horizontal plane of the body portion of the apparatus, the gaps configured to allow the apparatus to avoid contact with the support structure holding the substrate, as the apparatus is moved in a horizontal direction into position underneath the substrate during placement of the body portion of the apparatus in proximity to the substrate, and wherein, while the apparatus is positioned underneath and in proximity to the substrate, the apparatus is located between the substrate and the heat source.

* * * * *